(12) United States Patent
Ohara

(10) Patent No.: US 7,230,446 B2
(45) Date of Patent: Jun. 12, 2007

(54) SEMICONDUCTOR LOGIC CIRCUIT DEVICE HAVING PULL-UP/PULL-DOWN CIRCUIT FOR INPUT BUFFER PAD AND WAFER-PROBING TESTING METHOD THEREFOR

(75) Inventor: Yoshihiro Ohara, Kanagawa (JP)

(73) Assignee: NEC Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 10/964,928

(22) Filed: Oct. 15, 2004

(65) Prior Publication Data

US 2005/0093568 A1    May 5, 2005

(30) Foreign Application Priority Data

Oct. 17, 2003    (JP)    ............................. 2003-358252

(51) Int. Cl.
*H03K 19/00* (2006.01)
*G01R 31/28* (2006.01)

(52) U.S. Cl. .......................................... 326/16; 714/727
(58) Field of Classification Search ............ 326/26–27, 326/38–47, 82–86, 16; 714/724–727
See application file for complete search history.

(56) References Cited

U.S. PATENT DOCUMENTS

| | | | | |
|---|---|---|---|---|
| 5,115,191 A | * | 5/1992 | Yoshimori | ................... 714/724 |
| 5,644,251 A | * | 7/1997 | Colwell et al. | ................ 326/16 |
| 5,670,890 A | | 9/1997 | Colwell et al. | |
| 5,757,820 A | * | 5/1998 | Angelotti | ..................... 714/738 |
| 6,539,511 B1 | | 3/2003 | Hashizume | |
| 2001/0052095 A1 | * | 12/2001 | Ryan et al. | .................. 714/724 |
| 2004/0128596 A1 | * | 7/2004 | Menon et al. | ............... 714/724 |

FOREIGN PATENT DOCUMENTS

JP    58-118123    7/1983
JP    07-84009     3/1995

OTHER PUBLICATIONS

European Office Action dated Jun. 2, 2005.
European Search Report dated Feb. 4, 2005.

* cited by examiner

*Primary Examiner*—James Cho
*Assistant Examiner*—Jason Crawford
(74) *Attorney, Agent, or Firm*—McGinn IP Law Group, PLLC

(57) ABSTRACT

In a semiconductor logic circuit device including an internal circuit, a group of first pads, a group of second pads, and a plurality of input buffers, each connected between the internal circuit and one of the first and second pads, for supplying input signals from their corresponding pads to the internal circuit, each of the first pads is connected to at least one of a pull-up circuit for pulling up a voltage at each of the first pads to a first voltage, and a pull-down circuit for pulling down the voltage at each of the first pads to a second voltage lower than the first voltage.

21 Claims, 15 Drawing Sheets

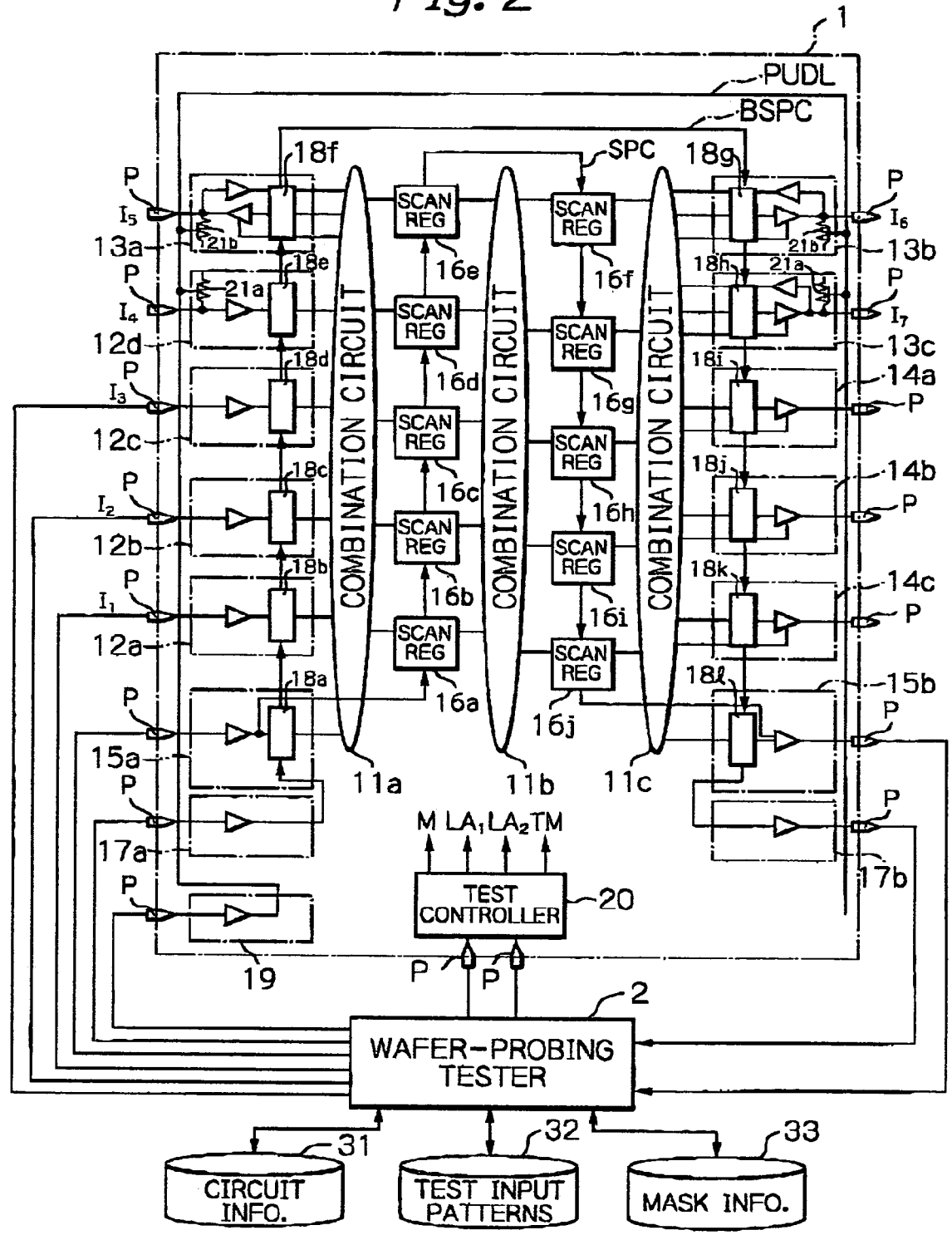

Fig. 4

| No. | TEST INPUT PATTERN | | | | | | |
|---|---|---|---|---|---|---|---|
| | $I_1$ | $I_2$ | $I_3$ | $I_4$ | $I_5$ | $I_6$ | $I_7$ |
| T0 | 1 | 1 | 0 | 1 | 0 | 0 | 1 |
| T1 | 0 | 0 | 1 | 1 | 0 | 0 | 1 |
| T2 | 1 | 1 | 1 | 1 | 0 | 0 | 1 |
| T3 | 1 | 1 | 0 | 1 | 0 | 0 | 1 |
| T4 | 0 | 0 | 1 | 1 | 0 | 0 | 1 |
| T5 | 1 | 0 | 1 | 1 | 0 | 0 | 1 |
| T6 | 0 | 1 | 1 | 1 | 0 | 0 | 1 |
| T7 | 0 | 1 | 0 | 1 | 0 | 0 | 1 |
| T8 | 0 | 1 | 0 | 1 | 0 | 0 | 1 |
| ⋮ | ⋮ | ⋮ | ⋮ | ⋮ | ⋮ | ⋮ | ⋮ |

Fig. 8

| No. | FINAL TEST INPUT PATTERN | | | |
|---|---|---|---|---|
| | $I_1$ | $I_2$ | $I_3$ | PUDL $(I_4, I_5, I_6, I_7)$ $=(1,0,0,1)$ |
| T0 | 1 | 1 | 0 | 1 |
| T1 | 0 | 0 | 1 | 1 |
| T2 | 1 | 1 | 1 | 1 |
| T3 | 1 | 1 | 0 | 1 |
| T4 | 0 | 0 | 1 | 1 |
| T5 | 1 | 0 | 1 | 1 |
| T6 | 0 | 1 | 1 | 1 |
| T7 | 0 | 1 | 0 | 1 |
| T8 | 0 | 1 | 0 | 1 |
| ⋮ | ⋮ | ⋮ | ⋮ | ⋮ |

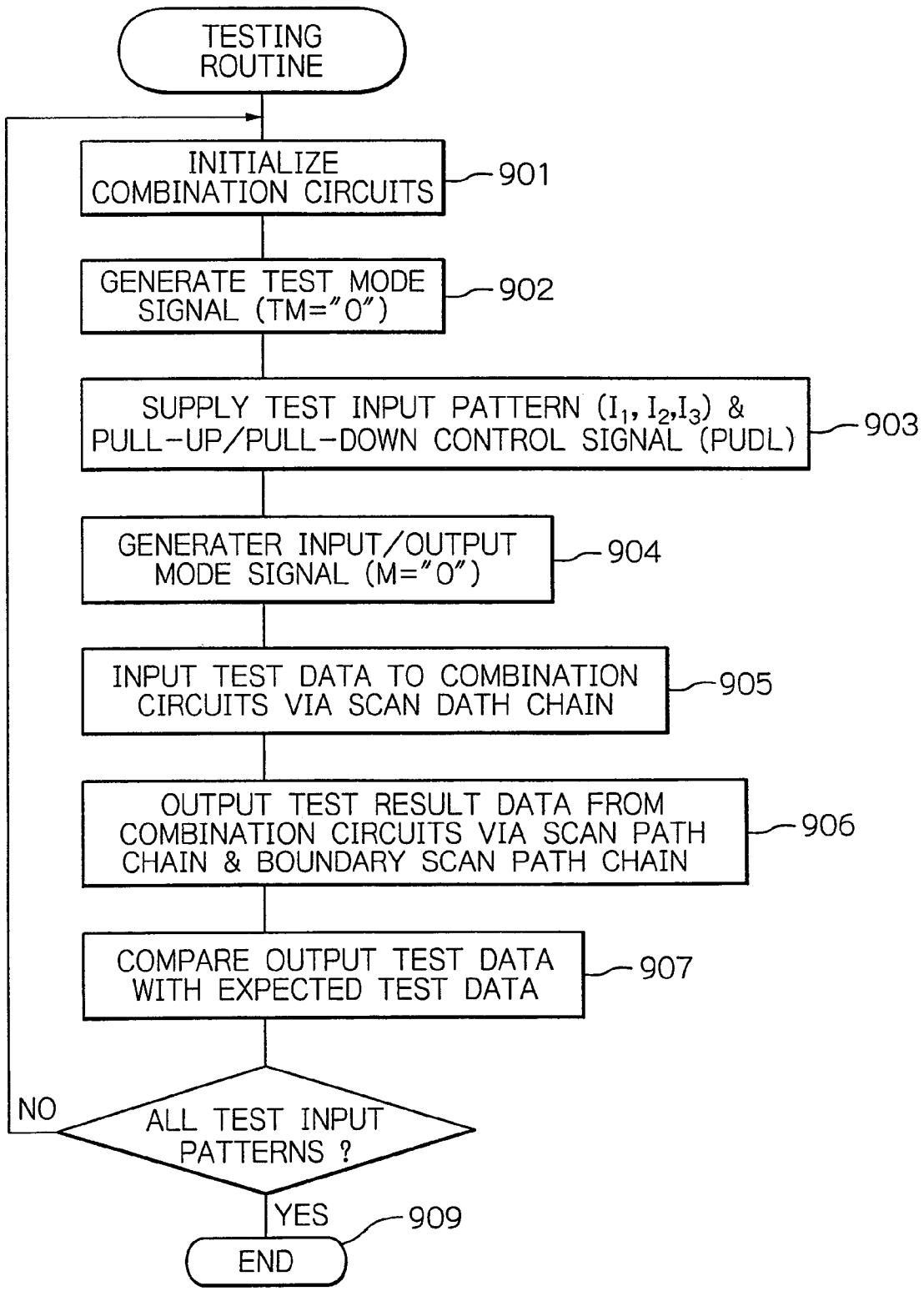

Fig. 10B

| No. | FINAL TEST INPUT PATTERN | | | | |
|---|---|---|---|---|---|
| | $I_1$ | $I_2$ | $I_3$ | DUDL 1 $(I_4, I_5, I_6, I_7)$ =(1,0,0,1) | DUDL 2 $(I_4, I_5, I_6, I_7)$ =(0,1,1,0) |
| T0 | 1 | 1 | 0 | 1 | 0 |
| T1 | 0 | 0 | 1 | 1 | 0 |
| T2 | 1 | 1 | 1 | 1 | 0 |
| T3 | 1 | 1 | 0 | 1 | 0 |
| T4 | 0 | 0 | 1 | 1 | 0 |
| T5 | 1 | 0 | 1 | 1 | 0 |
| T6 | 0 | 1 | 1 | 1 | 0 |
| T7 | 0 | 1 | 0 | 1 | 0 |
| T8 | 0 | 1 | 0 | 1 | 0 |
| ⋮ | ⋮ | ⋮ | ⋮ | ⋮ | ⋮ |
| T11 | 1 | 1 | 0 | 0 | 1 |
| T12 | 0 | 0 | 1 | 0 | 1 |
| T13 | 1 | 1 | 1 | 0 | 1 |
| T14 | 1 | 1 | 0 | 0 | 1 |
| T15 | 0 | 0 | 1 | 0 | 1 |
| T16 | 1 | 0 | 1 | 0 | 1 |
| ⋮ | ⋮ | ⋮ | ⋮ | ⋮ | ⋮ |

SEMICONDUCTOR LOGIC CIRCUIT DEVICE HAVING PULL-UP/PULL-DOWN CIRCUIT FOR INPUT BUFFER PAD AND WAFER-PROBING TESTING METHOD THEREFOR

BACKGROUND OF THE INVENTION

1. Field of the Invention

The present invention relates to a semiconductor logic circuit device and a wafer-probing testing method therefor.

2. Description of the Related Art

Generally, after a plurality of semiconductor logic circuit devices (chips) are formed on one wafer, a wafer-probing testing operation is performed upon each of the semiconductor logic circuit devices. As a result, only the semiconductor logic circuit devices which have passed the wafer-probing testing operation are diced and packaged, while the others are scraped.

Note that the number of pads of one semiconductor logic circuit device is considerably large, for example, 500 to 1000. Therefore, if a wafer-probing tester has pins (probes) corresponding to all the pads of semiconductor logic circuit devices, the wafer-probing tester would be considerably cost-consuming. Therefore, it is essential to decrease the number of pins (probes) of the wafer-probing tester.

A first prior art wafer probing testing method is carried out by using a probe card for connection between pads of a semiconductor logic circuit device and pins of a wafer-probing tester. In this case, the number of the pins of the wafer-probing tester is smaller than the number of the pads of the semiconductor logic circuit device, which would decrease the manufacturing cost of the wafer-probing tester. This will be explained later in detail.

In the above-described first prior art wafer-probing testing method, however, since a control circuit for controlling the probe card is incorporated into the semiconductor logic circuit device, the manufacturing cost thereof is increased. Also, since the probe card is designed specially for the semiconductor logic circuit device, the manufacturing cost of the wafer-probing tester is increased. This also will be explained later in detail.

A second prior art wafer-probing testing method is carried out by serially inputting a test input pattern (vector) into a semiconductor logic circuit device (see: JP-58-118123-A).

In the above-described second prior art wafer-probing testing method, however, since the test input pattern is serially inputted to the semiconductor logic circuit device, the test time becomes large.

A third prior art wafer-probing testing method is carried out by a probe card including a scan path between a semiconductor logic circuit device and a wafer-probing tester (see: JP-7-84009-A). As a result, a test input pattern (vector) is serially inputted to the scan path of the probe card which, in turn, transmits the test input pattern (vector) in parallel to the semiconductor logic circuit device.

In the above-described third prior art wafer-probing testing method, however, since the scan path is included in the probe card, the probe card is high in manufacturing cost. Also, since the probe card is designed specially for the semiconductor logic circuit device, the probe card is also high in manufacturing cost.

SUMMARY OF THE INVENTION

It is an object of the present invention to provide a semiconductor logic circuit device and its wafer-probing testing method capable of decreasing the test time without a specialized probe card.

According to the present invention, in a semiconductor logic circuit device including an internal circuit, a group of first pads, a group of second pads, and a plurality of input buffers, each connected between the internal circuit and one of the first and second pads, for supplying input signals from their corresponding pads to the internal circuit, each of the first pads is connected to at least one of a pull-up circuit for pulling up a voltage at each of the first pads to a first voltage, and a pull-down circuit for pulling down the voltage at each of the first pads to a second voltage lower than the first voltage.

Also, in a method for testing a semiconductor logic circuit device comprising an internal circuit, a group of first pads, a group of second pads and a plurality of input buffers each connected between the internal circuit and one of the first and second pads, each of the first pads being connected to at least one of a pull-up circuit and a pull-down circuit, predetermined reference voltages are applied to the first pads by operating the pull-up circuit and the pull-down circuit, and test input signals are applied to the second pads from the exterior.

BRIEF DESCRIPTION OF THE DRAWINGS

The present invention will be more clearly understood from the description set forth below, as compared with the prior art, with reference to the accompanying drawings, wherein:

FIG. 2 is a circuit diagram for explaining an embodiment of the wafer-probing testing method according to the present invention;

FIG. 4 is a table showing examples of test input patterns (vectors) of FIG. 2;

FIG. 8 is a table showing examples of final test input patterns of FIG. 7;

FIG. 9 is a flowchart for explaining a method for testing the semiconductor logic circuit device of FIG. 2;

FIG. 10B is a table showing examples of final test input patterns (vectors) obtained by adopting the modification of FIG. 10A.

DESCRIPTION OF THE PREFERRED EMBODIMENT

Before the description of the preferred embodiment, the first prior art wafer-probing testing method will be explained with reference to FIG. 1.

Figure 1:
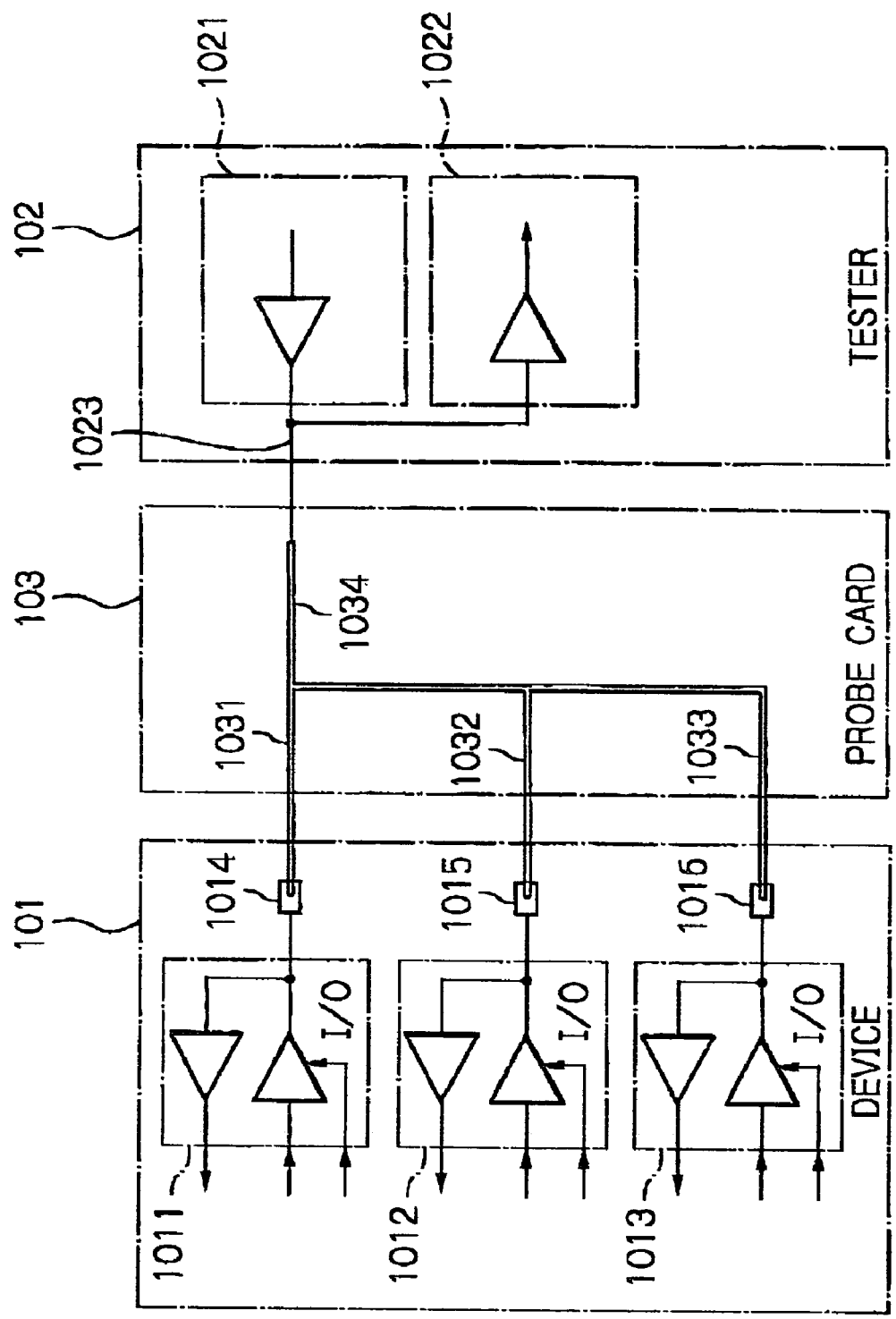
FIG. 1 is a block circuit diagram for explaining the first prior art wafer-probing testing method.

In FIGS. 1, reference numeral 101 designates a semiconductor logic circuit device before dicing, and 102 designates a wafer-probing tester. Also, a probe card 103 is provided between the semiconductor logic circuit device 101 and the wafer-probing tester 102.

The semiconductor logic circuit device 101 includes input/output buffers 1011, 1012 and 1013 connected to pads 1014, 1015 and 1016, respectively. On the other hand, the wafer-probing tester 102 includes a driver 1021 and a comparator 1022 connected to one pin 1023. In order to connect the pads 1014, 1015 and 1016 of the semiconductor logic circuit device 101 to the pin 1023 of the wafer-probing tester 103, the probe card 103 includes three device-side terminals 1031, 1032 and 1033 connectable to the pads 1014, 1015 and 1016 and one tester-side terminal 1034 connectable to the pin 1023. In this case, the device-side terminals 1031, 1032 and 1033 are combined and connected to the tester-side terminal 1034.

Thus, the number of pins of the wafer-probing tester 102 is decreased to decrease the manufacturing cost thereof.

In FIG. 1, however, the same input signal is supplied from the tester-side terminal 1034 to all the device-side terminals 1031, 1032 and 1033, while one output signal is supplied from one of the device-side terminals 1031, 1032 and 1033 to the tester-side terminal 1034. In this case, one of the device-side terminals 1031, 1032 and 1033 has to be in a bidirectional state while the others have to be in a high impedance state. A control circuit for realizing such a bidirectional state and a high impedance state is incorporated into the semiconductor logic circuit device 103, thus increasing the manufacturing cost thereof. Also, since the probe card 103 is designed specially for the semiconductor logic circuit device 101, the manufacturing cost of the wafer-probing tester 102 is increased. Note that, if the probe card 103 is generalized, the design freedom of the semiconductor logic circuit device 101 is restricted.

In FIG. 2, which is a block circuit diagram for explaining an embodiment of the wafer-probing testing method according to the present invention, reference numeral 1 designates a semiconductor logic circuit device in a wafer state, 2 designates a wafer-probing tester, 31 designates a circuit information storing unit, 32 designates a test input pattern (vector) storing unit, and 33 designates a mask information storing unit.

The semiconductor logic circuit device 1 is connected by a probe card (not shown) to the wafer-probing tester 2. In more detail, probes of the probe card are connected to the pads of the semiconductor logic circuit device 1, while other probes of the probe card are connected to the wafer-probing tester 2.

The semiconductor logic circuit device 1 is constructed by an internal circuit formed by combination circuits 11a, 11b and 11c each including gate circuits such as AND gates, NAND gates, OR gates and NOR gates.

Input buffers 12a, 12b, 12c and 12d and an input/output buffer 13a are connected to the combination circuit 11a, and input/output buffers 13b and 13c and output buffers 14a, 14b and 14c are connected to the combination circuit 11c. Note that other input buffers, other input/output buffers and other output buffers are connected to the combination circuits 11a and 11c; however, such buffers are omitted for simplifying the description.

A scan path chain SPC is provided between a scan-in buffer 15a and a scan-out buffer 15b. The scan path chain SPC is constructed by serially-connected scan path registers 16a, 16b, 16c, 16d, 16e, 16f, 16g, 16h, 16i and 16j. The scan path registers 16a to 16e are connected to the combination circuits 11a and 11b, and the scan path registers 16f to 16i are connected to the combination circuits 11b and 11c. The scan path chain SPC receives serial data from the wafer-probing tester 2 via the scan-in buffer 15a, so that the serial data is stored in the scan path registers 16a to 16j, and then, are inputted to the combination circuits 11a, 11b and 11c. On the other hand, the scan path chain SPC receives parallel data from the combination circuits 11a, 11b and 11c to store them in the scan path registers 16a to 16j, and then output them to the wafer-probing tester 2 via the scan-out buffer 15b.

A boundary scan path chain BSPC is provided between a boundary scan-in buffer 17a and a boundary scan-out buffer 17b. The boundary scan path chain BSPC is constructed by serially-connected boundary scan path registers 18a, 18b, 18c, 18d, 18e, 18f, 18g, 18h, 18i, 18j, 18k and 18l, which are incorporated into the scan-in buffer 15a, the input buffers 12a, 12b, 12c, 12d, the input/output buffers 13a, 13b and 13c, the output buffers 14a, 14b and 14c, and the scan-out buffer 15b, respectively. The boundary scan path registers 18a to 18f are connected to the combination circuit 11a, and the boundary scan path registers 18g to 18l are connected to the combination circuit 11c. The boundary scan path chain BSPC receives serial data from the wafer-probing tester 2 via the boundary scan-in buffer 17a, so that the serial data is stored in the boundary scan path registers 18a to 18l, and then, are inputted to the combination circuits 11a and 11c. On the other hand, the boundary scan path chain BSPC receives parallel data from the combination circuits 11a and 11c to store them in the boundary scan path registers 18a to 18l, and then output them to the wafer-probing tester 2 via the boundary scan-out buffer 17b.

Also, a pull-up/pull-down control line PUDL Is provided and connected to a pull-up/pull-down control buffer 19.

Further, a test controller 20 is provided to generate an input/output mode control signal M, latch signals $LA_1$ and $LA_2$, and a test mode signal TM.

Pads P are provided and connected to the input buffers 12a to 12d, the input/output buffers 13a to 13c, the output buffers 14a to 14c, the scan-in buffer 15a, the scan-out buffer 15b, the boundary scan-in buffer 17a, the boundary scan-out buffer 17b, the pull-up/pull-down control buffer 19, and the test controller 20. The pads P of the input buffer 12a, 12b and 12c, the pads P of the scan-in buffer 15a and the scan-out buffer 15b, the pads P of the boundary scan-in buffer 17a and the boundary scan-out buffer 17b, the pad P of the pull-up/pull-down control buffer 19, and the pads P of the test controller 20 are connected to the wafer-probing tester 2, while the pads P of the input buffer 12d and the pads P of the input/output buffers 13a, 13b and 13c, and the pads P of the output buffers 14a, 14b and 14c are in a floating state.

Since the pads P of the inputbuffer 12d and the pads P of the input/outputbuffers 13a, 13b and 13c are in a floating state, a pull-up circuit 21a or a pull-up circuit 21b is incorporated into each of the input buffer 12d and the input/output buffers 13a, 13b and 13c, thus pulling up or pulling down the voltage at the pads P thereof.

The pull-up circuit 21a and the pull-down circuit 21b are controlled by the voltage at the pull-up/pull-down control line PUDL which is also controlled by the pull-up/pull-down control buffer 19.

Figure 3A:
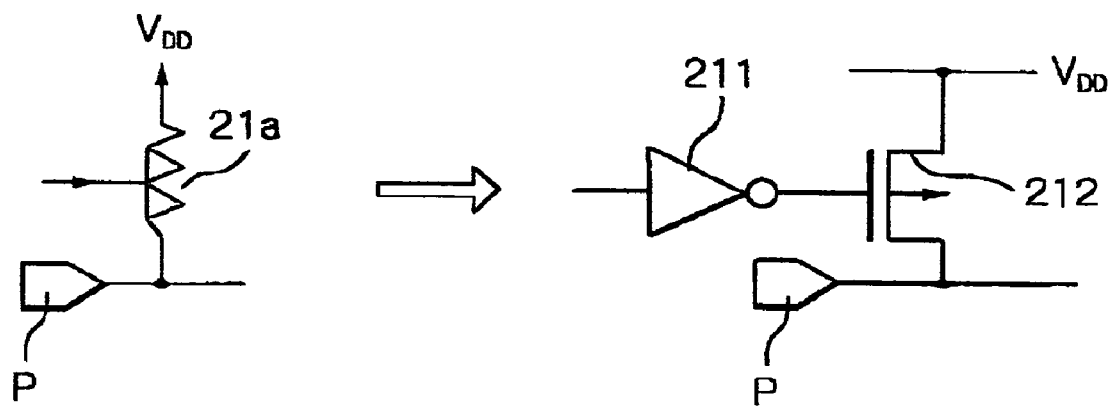
FIG. 3A is a circuit diagram of the pull-up circuit of FIG. 2.

As illustrated in FIG. 3A, the pull-up circuit 21a is constructed by an inverter 211 and a P-channel KOS transistor 212. Therefore, if the voltage at the pull-up/pull-down control line PUDL is low (="0"), the P-channel MOS transistor 212 is turned OFF, so that the pad P is in a floating state. On the other hand, if the voltage at the pull-up/pull-down control line PUDL is high (="1"), the P-channel KOS transistor 212 is turned ON, so that the voltage at the pad P becomes $V_{DD}$(="1").

Figure 3B:
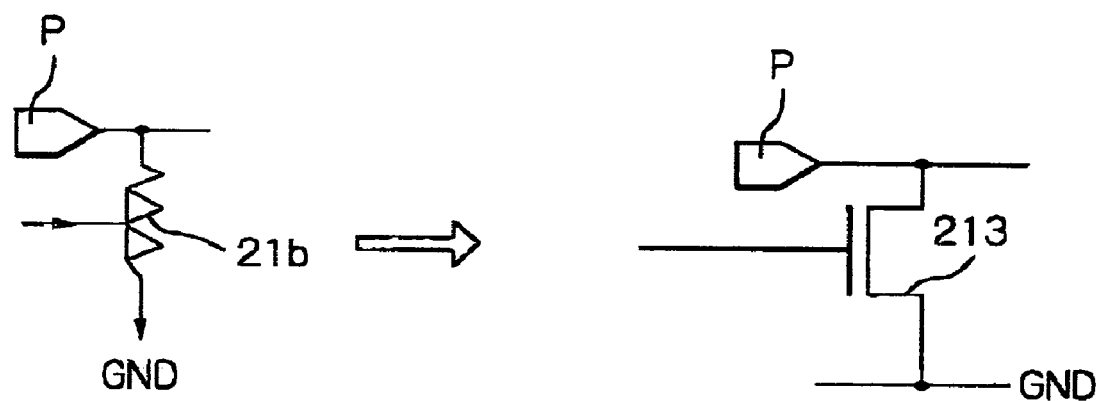
FIG. 3B is a circuit diagram of the pull-down circuit of FIG. 2.

Also, as illustrated in FIG. 3B, the pull-down circuit 21b is constructed by an N-channel MOS transistor 213. Therefore, if the voltage at the pull-up/pull-down control line PUDL is low (="0"), the N-channel MOS transistor 213 is turned OFF, so that the pad P is in a floating state. On the other hand, if the voltage at the pull-up/pull-down control line PUDL is high (="1"), the N-channel MOS transistor 213 is turned ON, so that the voltage at the pad P becomes GND(="0").

Therefore, if test input patterns (vectors) are defined by ($I_1$, $I_2$, $I_3$, $I_4$, $I_5$, $I_6$, $I_7$) where $I_1$, $I_2$, $I_3$, $I_4$, $I_5$, $I_6$ and $I_7$ are input signals at the pads P of the input buffers 12a, 12b, 12c and 12d, and the input/output buffers 13a, 13b and 13c, respectively, examples of the test input buffers (vectors) are shown in FIG. 4. That Is, although the input signals $I_4$, $I_5$, $I_6$ and $I_7$ are fixed at 1, 0, 0 and 1, respectively, the input signals $I_1$, $I_2$ and $I_3$ are arbitrarily determined by the wafer-probing tester 2.

An example of the input buffer such as 12d is explained next with reference to FIG. 5A.

Figure 5A:
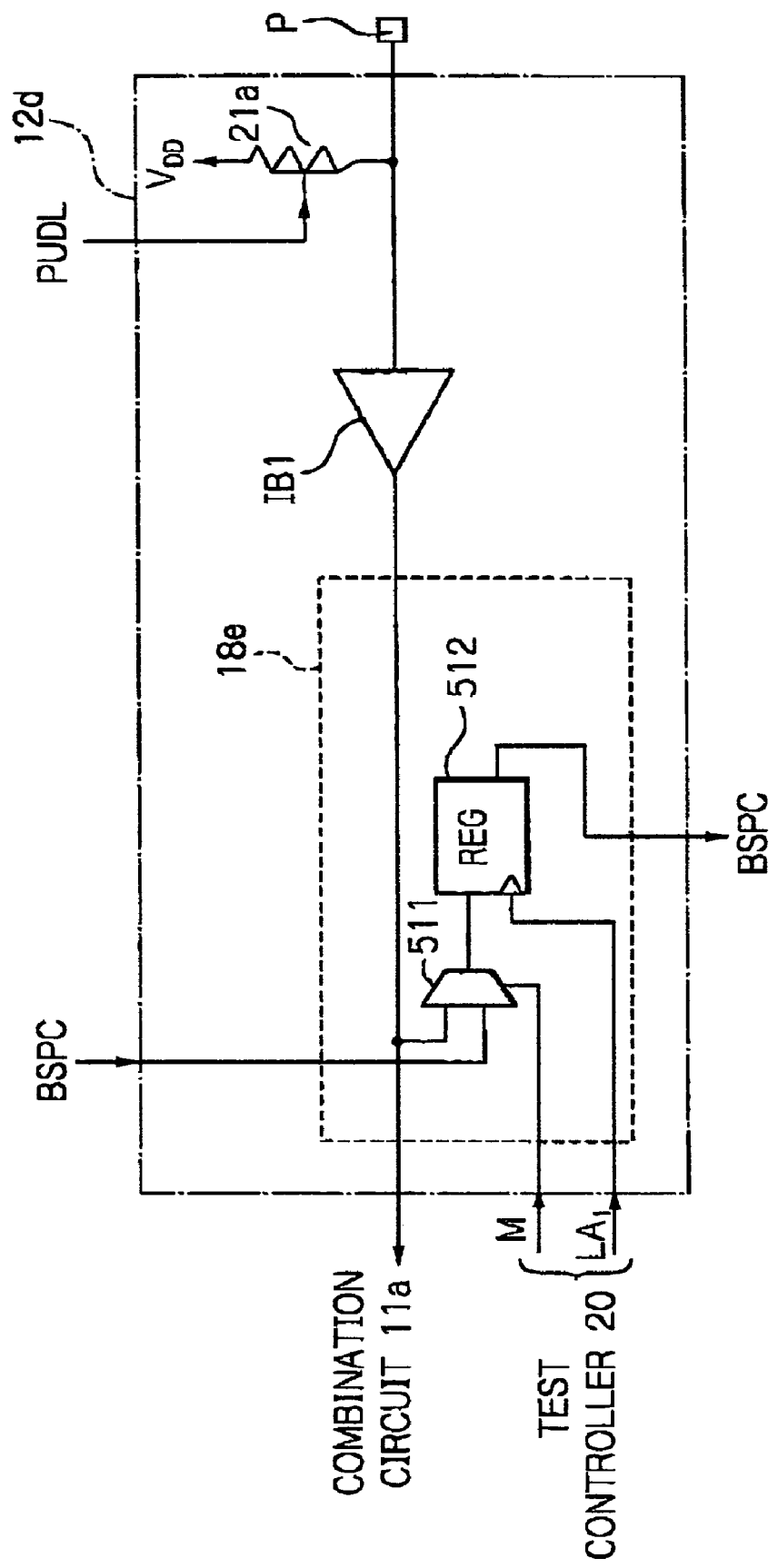
FIG. 5A is a detailed circuit diagram of the input buffer of FIG. 2.

In FIG. 5A, the pad P is connected via an input buffer IB1 to the combination circuit 11a. The boundary scan path register 18e for serially transmitting data is constructed by a selector 511 controlled by the input/output mode signal M of the test controller 20 and a register 512 controlled by the latch signal $LA_1$ of the test controller 20.

In an input mode from the pad P, the input/output mode signal M becomes "0" (parallel mode) so that the selector 511 selects its upper input. Even in this case, input data from the pad P can be stored in the combination circuit 11a.

In a boundary scan path chain shift mode, the input/output mode signal M becomes "1" (shift mode) so that the selector 511 selects its low input. Thus, data at the boundary scan path chain BSPC can be shifted by the register 512 in synchronization with the latch signal $LA_1$.

Also, in the input buffer 12d, the pull-up circuit 21a controlled by the voltage at the pull-up/pull-down control line PUDL is connected to the pad P. Therefore, when the pull-up circuit 21a is turned ON by the voltage at the pull-up/pull-down control line PUDL, the voltage at the pad P becomes "1" (high level) in spite of the input/output mode signal M (parallel mode/shift mode) without receiving a voltage from the wafer-probing tester 2.

An example of the input/output buffer such as 13a is explained next with reference to FIG. 5B.

Figure 5B:
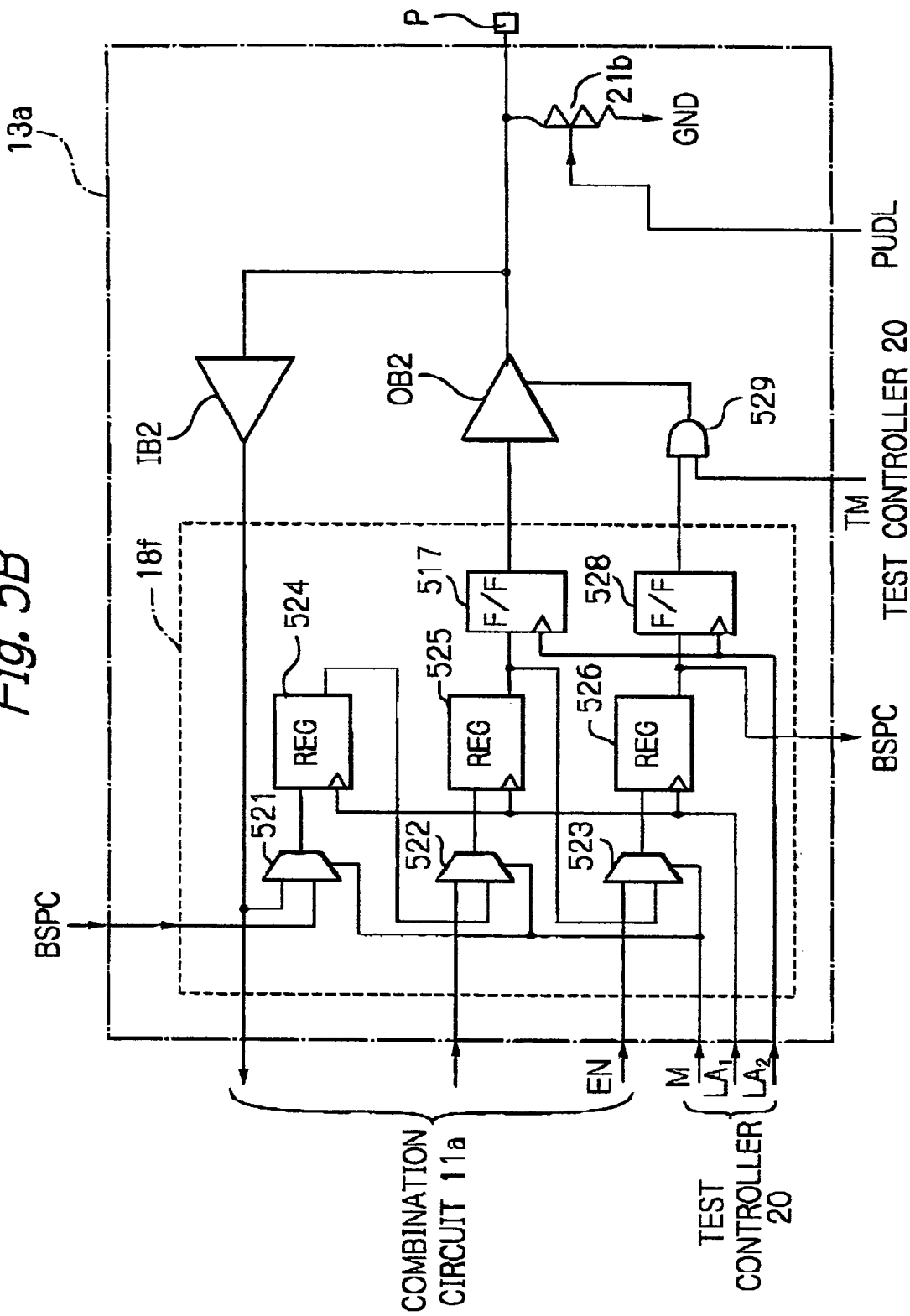
FIG. 5B is a detailed circuit diagram of the input/output buffer of FIG. 2.

In FIG. 5B, the pad P is connected via an input buffer IB2 to the combination circuit 11a. The pad P is also connected to an output buffer OB2. The boundary scan path register 18f for serially transmitting data is constructed by selectors 521, 522 and 523 controlled by the input/output mode signal N of the test controller 20 and registers 524, 525 and 526 controlled by the latch signal $LA_1$ of the test controller 20, and flip-flops 527 and 528 controlled by the latch signal $LA_2$ of the test controller 20. Also, an AND circuit 529 is provided for receiving an enable signal EN of the combination circuit 11a and the test mode signal TM of the test controller 20. Note that the test mode signal TM is "0" only in a test pattern input mode.

In an input mode from the pad P, the input/output mode signal M becomes "0" (parallel mode) so that the selectors 521, 522 and 523 select their upper inputs. Even in this case, input data from the pad P can be inputted to the combination circuit 11a.

In a boundary scan path chain input mode from the combination circuit 11a, the input/output mode signal M becomes "0" (parallel mode) so that the selector 521, 522 and 523 select their upper inputs. Also, in this case, the output buffer OB2 is made in a high impedance state by the test mode signal TM using the AND circuit 529, and the pull-down circuit 21b is turned ON by the voltage at the pull-up/pull-down control line PUDL. Thus, input data from the combination circuit 11a can be stored in the registers 525 and 526 in synchronization with the latch signal $LA_1$. Note that the output buffer OB2 can also be made in a high impedance state by the enable signal EN (="0") using the AND circuit 529 in synchronization with the latch signals $LA_1$ and $LA_2$.

In a boundary scan path chain shift mode, the input/output mode signal M becomes "1" (shift mode) so that the selectors 521, 522 and 523 select their lower inputs. Thus, data at the boundary scan path chain BSPC can be shifted by the registers 524, 525 and 526 in synchronization with the latch signal $LA_1$.

In a boundary scan path chain output mode to the combination circuit 11a, the input/output mode signal M becomes "0" (parallel mode) so that the selectors 521, 522 and 523 select their upper inputs. Also, the enable signal EN is "1" and the test mode signal TM is "1". Thus, data in the register 525 can be outputted via the output buffer OB2 and the input buffer IB2 to the combination circuit 11a in synchronization with the latch signal $LA_2$.

In an output mode from the combination circuit 11a to the pad P, the input/output mode signal M becomes "0" (parallel mode) so that the selectors 521, 522 and 523 select their upper inputs. Also, the enable signal EN is "1" and the test mode signal TM is "1". Thus, data can be outputted from the combination circuit 11a via the output buffer OB2 to the pad P in synchronization with the enable signal EN passed by the latch signal $LA_1$ and $LA_2$.

In a test mode where M="0", EN="0" and TM="1", a probe from the wafer-probing tester 2 is connected to the pad P, so that the voltage at the pad P is determined by the wafer-probing tester 2.

In a test pattern input mode, the test mode signal TM is made "0" by the test controller 20. As a result, data at the pad P can be inputted via the input buffer IB2 to the combination circuit 11a.

Also, in the input/output buffer 13a, the pull-down circuit 21b controlled by the voltage at the pull-up/pull-down control line PUPL is connected to the pad P. Therefore, when the pull-down circuit 21b is turned ON by the voltage at the pull-up/pull-down control line PUDL and the output buffer OB2 is made in a high impedance state by the test mode signal TM (="0"), the voltage at the pad P becomes "0" (low level) in spite of the input/output mode signal M (parallel mode/shift mode) without receiving a voltage from the wafer-probing tester 2.

An example of the output buffer such as 14a is explained next with reference to FIG. 5C.

Figure 5C:
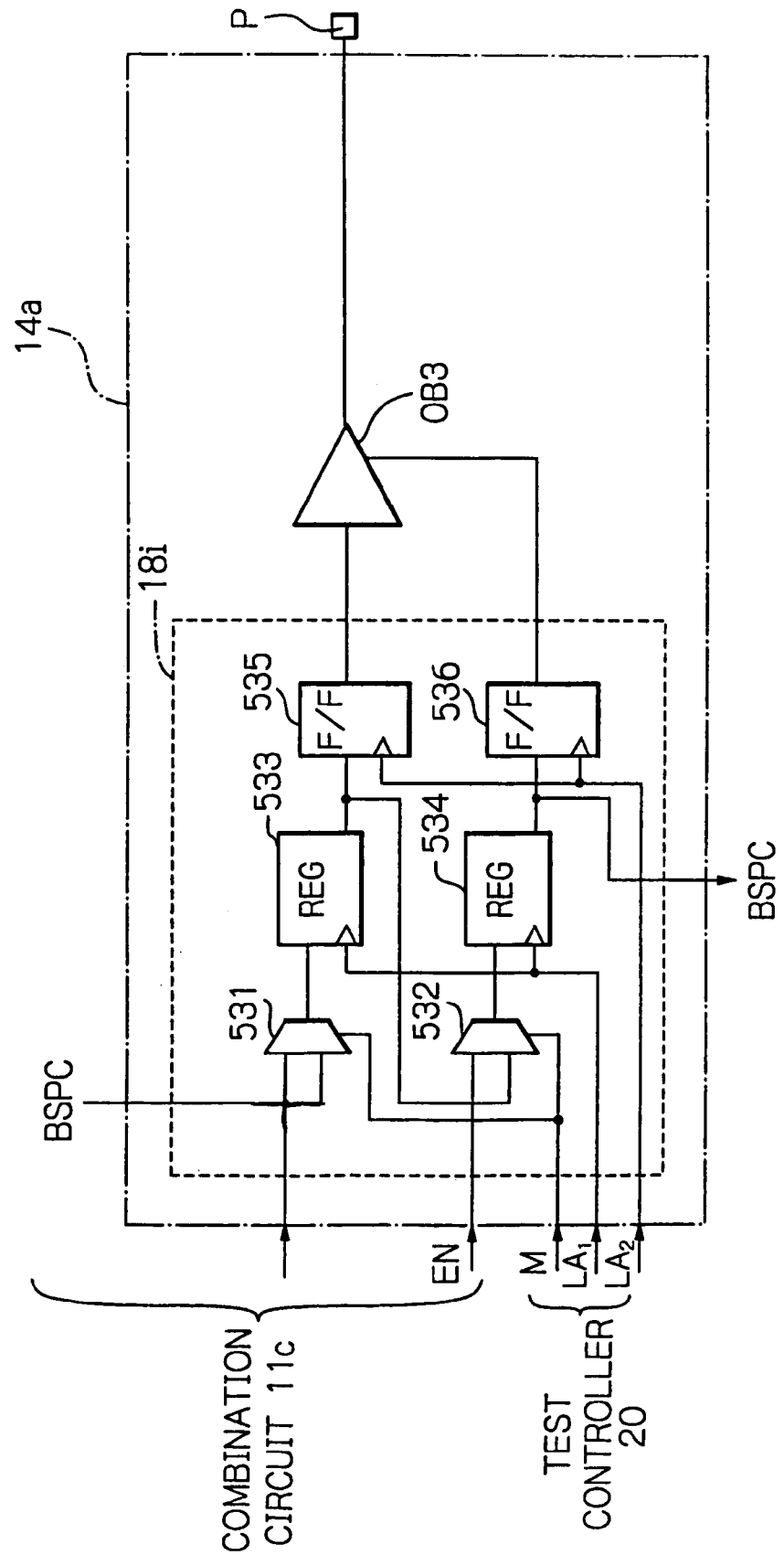
FIG. 5C is a detailed circuit diagram of the output buffer of FIG. 2.

In FIG. 5C, the pad P is connected to an output buffer OB3. The boundary scan path register 18i for serially transmitting data is constructed by selectors 531 and 532 controlled by the input/output mode signal M of the test controller 20 and boundary scan path registers 533 and 534 controlled by the latch signal $LA_1$ of the test controller 20, and flip-flops 535 and 536 controlled by the latch signal $LA_2$ of the test controller 20.

In a boundary scan path chain shift mode, the input/output mode signal M becomes "1" (shift mode) so that the selectors 531 and 532 select their lower inputs. Thus, data at the boundary scan path chain BSPC can be shifted by the registers 533 and 534 in synchronization with the latch signal $LA_1$.

In an output mode from the combination circuit 11c to the pad P, the input/output mode signal X becomes "0" (parallel mode) so that in the selectors 531 and 532 select their upper inputs. Also, in this case, the pad P is made in a floating state by the pull-up/pull-down control line PUDL. Thus, data can be outputted from the combination circuit 11c via the output buffer OB3 to the pad P in synchronization with the enable signal EN passed by the latch signal $LA_1$ and $LA_2$.

A pre-processing operation is explained next with reference to FIG. 6. Note that the pre-processing operation is used for determining final test input patterns and mask information of the semiconductor logic circuit device 1 of FIG. 2.

Figure 7:
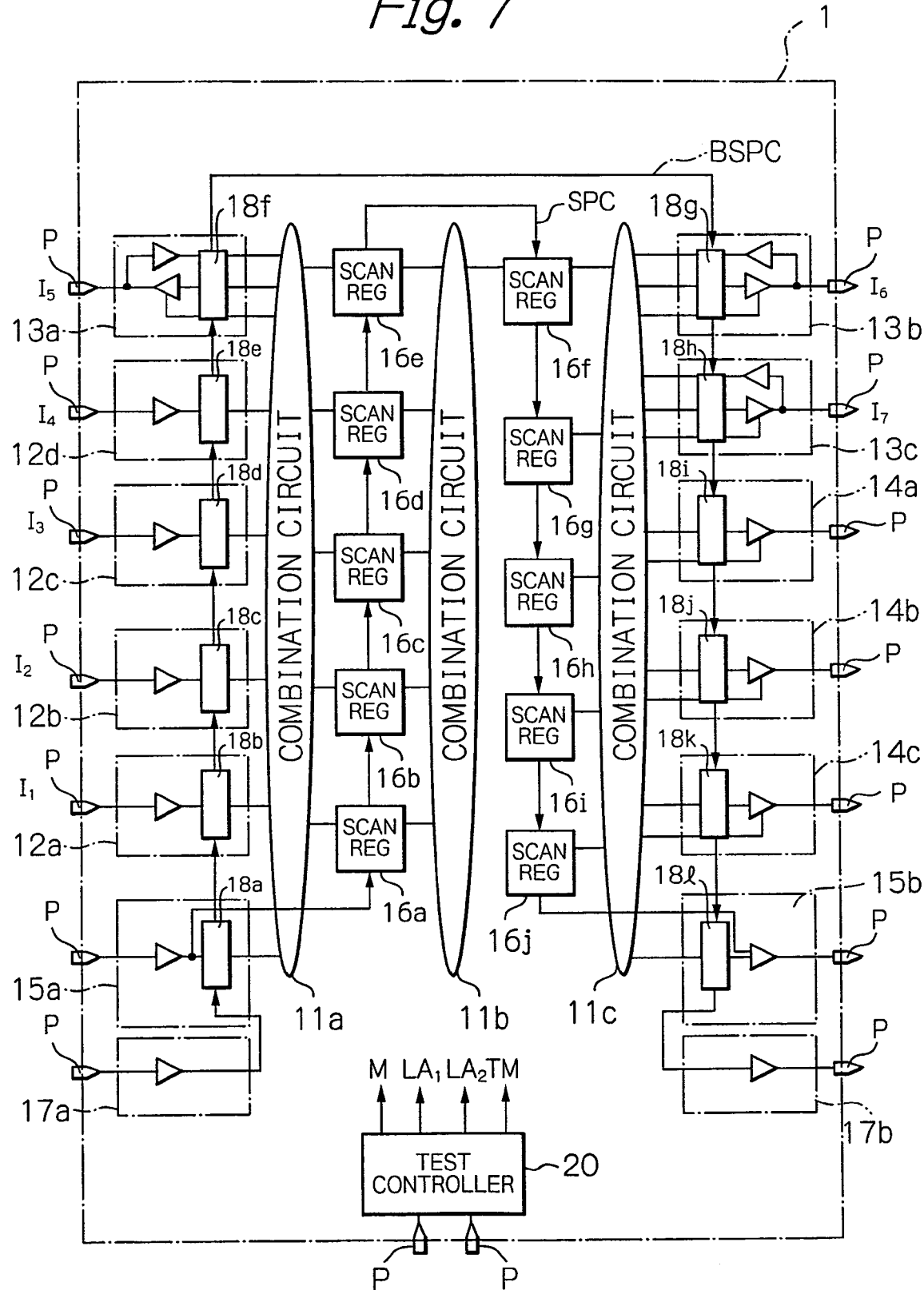
FIG. 7 is a circuit diagram of a semiconductor logic circuit device originally defined by the circuit information of FIG. 6.

First, at step 601, circuit information is read from the circuit information storing unit 31. In this case, the circuit information includes gate information such as AND gates, NAND gates, OR gates and NOR gates, flip-flop information and the regarding a semiconductor logic circuit as illustrated in FIG. 7 where a pull-up/pull-down control buffer 19, pull-up circuits 21a and pull-down circuits 21b of FIG. 2 are excluded.

Next, at step 602, in order to effectively detect faults of the internal circuit formed by the combination circuits 11a, 11b and 11c, original test input patterns (vectors) supplied to the pads P of the input buffers 12a, 12b, 12c and 12d and the pads P of the input/output buffers 13a, 13b and 13c are determined.

Next, at step 603, a group of the input buffers 12a, 12b, 12c and 12d and the input/output buffers 13a, 13b and 13c are selected in view of the number of probes of the wafer-probing tester 2 and the values of the test input patterns. For example, if the original test input patterns are shown in FIG. 4, the values $I_4$, $I_5$, $I_6$ and $I_7$ are fixed at 1, 0, 0 and 1, respectively, the input buffer 12d and the input/output buffers 13a, 13b and 13c are selected, In this case, the smaller the number of probes of the wafer-probing tester 2, the larger the number of selected input buffers and input/output buffers.

Next, at step 604, a pull-up circuit 21a or a pull-down circuit 21b is assigned to each of the selected input buffers and input/output buffers. For example, as shown in FIG. 4, if the values $I_4$ and $I_7$ are fixed at "1", a pull-up circuit 21a is assigned to each of the input buffer 12d and the input/output buffer 13c, and also, if the values $I_5$ and $I_6$ are fixed at "0", a pull-up circuit 21b is assigned to each of the input/output buffer 13a and 13b.

Next, at step 605, the circuit information is renewed by adding the assigned pull-up circuits and pull-down circuits thereto, and is again stored in the circuit information storing unit 31.

Next, at step 606, final test input patterns are determined. For example, if the original test input patterns are shown in FIG. 4, the final test input patterns along with data of the pull-up/pull-down control line PUDL are shown in FIG. 8. The final test input patterns are stored in the test input pattern storing unit 32.

Next, at step 607, mask information of layouts of the semiconductor logic circuit device including the pull-up/pull-down circuit information is formed and stored in the mask information storing unit 33.

Figure 6:
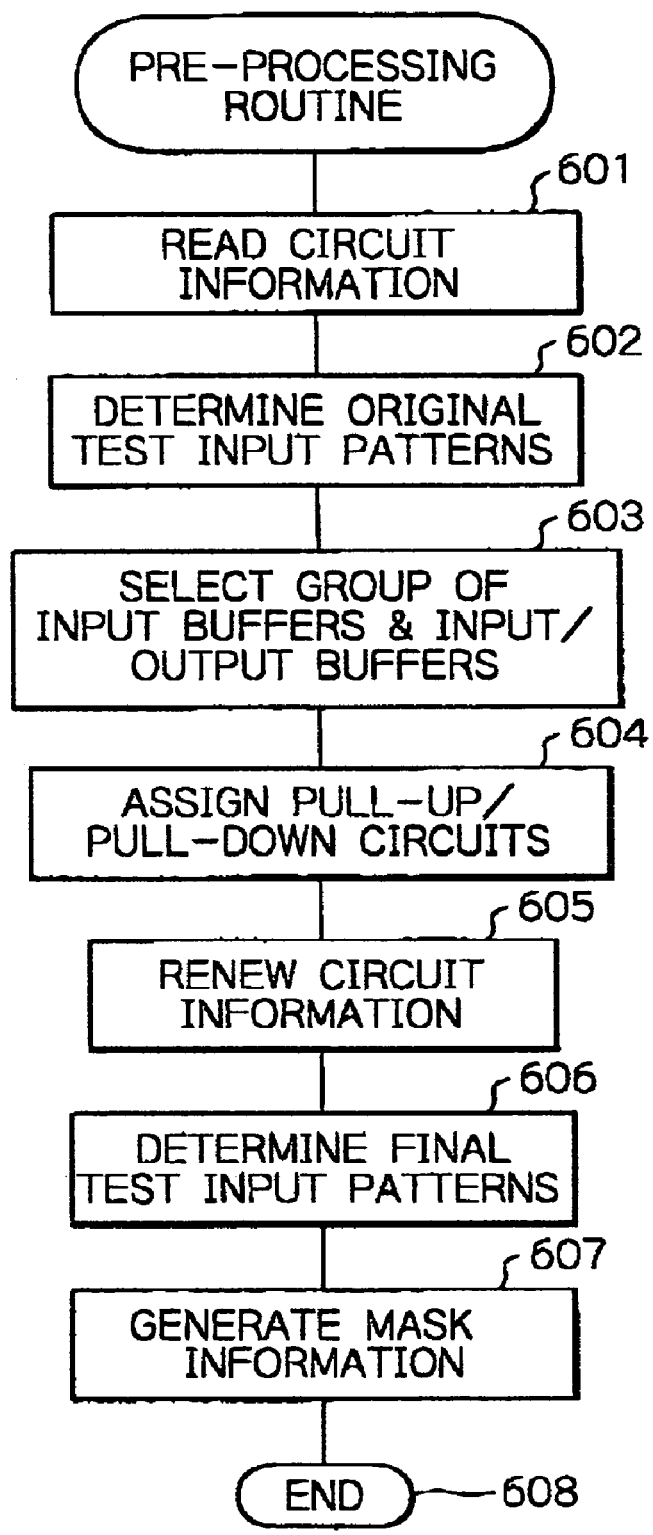
FIG. 6 is a flowchart for explaining a method for determining final test input patterns (vectors) and mask information of the semiconductor logic circuit device of FIG. 2.

The routine of FIG. 6 is completed by step 608.

Thereafter, masks are manufactured in accordance with the mask information stored in the mask information storing unit 33, and semiconductor logic circuit devices are manufactured by using such masks.

A testing operation is explained next with reference to FIG. 9. Here, as illustrated in FIG. 2, the probes of the wafer-probing tester 2 are connected to the pads P of the input buffers 12a, 12b and 12c, while the pads P of the input buffer 12d and the input/output buffers 13a, 13b and 13c are in a floating state.

First, at step 901, the combination circuits 11a, 11b and 11c are initialized by using the scan path chain SPC and the boundary scan path chain BSPC. This initialization has no direct relationship to the present invention, and therefore, its detailed description is omitted.

Next, at step 902, a test mode signal TM (="0") is generated through the test controller 20. As a result, the output buffers OB2 (see: FIG. 5B) of the input/output buffers 13a, 13b and 13c are disabled, so that the input/output-buffers 13a, 13b and 13c serve as input buffers.

Next, at step 903, a test input pattern ($I_1$, $I_2$, $I_3$) is supplied to the pads P of the input buffers 12a, 12b and 12c in parallel from the wafer-probing tester 2. Simultaneously, a pull-up/pull-down control signal is supplied to the pad P of the pull-up/pull-down control buffer 19, so that a predetermined test input pattern ($I_4$, $I_5$, $I_6$, $I_7$)=(1, 0, 0, 1) is supplied to the pads P of the input buffer 12d and the input/output buffers 13a, 13b and 13c. Here, a final test input pattern is a combination of the test input pattern ($I_1$, $I_2$, $I_3$) and the predetermined test input pattern ($I_4$, $I_5$, $I_6$, $I_7$)=(1, 0, 0, 1).

Next, at step 904, an input/output mode signal M is caused to be "0" (parallel mode). As a result, the final test input pattern ($I_1$, $I_2$, $I_3$, $I_4$, $I_5$, $I_6$, $I_7$) is inputted to the combination circuits 11a and 11c.

Next, at step 905, test data is inputted from the scan-in buffer 15a via the scan path chain SPC to the combination circuits 11a, 11b and 11c. Thus, the combination circuits 11a, 11b and 11c are operated.

Next, at step 906, test result data is outputted from the combination circuits 11a, 11b and 11c via the scan path chain SPC and the boundary scan path chain BSPC to the scan-out buffer 15b and the boundary scan-out buffer 17b.

Next, at step 907, the test result data is compared with its expected data.

Step 908 repeats the control at steps 901 to 907 for all the test input patterns ($I_1$, $I_2$, $I_3$).

The routine of FIG. 9 is completed by step 909.

According to the above-described embodiment, since the above-mentioned combined test input pattern (vector) as a final test input pattern is inputted in parallel to the combination circuits 11a and 11c, the test time can be decreased. Also, since the number of probes (pins) of the wafer-probing tester 2 is decreased, an inexpensive universal probe card, not an expensive, specialized probe card, would be used, which would decrease the manufacturing cost of the wafer-probing tester 2 and would broaden the design freedom of the semiconductor logic circuit device 1.

In the above-described embodiment, although a pull-up circuit 21a or a pull-down circuit 21b can be assigned to all the input buffers and all the input/output buffers, the number of test input patterns is remarkably decreased.

In order to increase the number of test input patterns, the number of pull-up/pull-down control lines PUPL can be 2 or more.

Figure 10A:
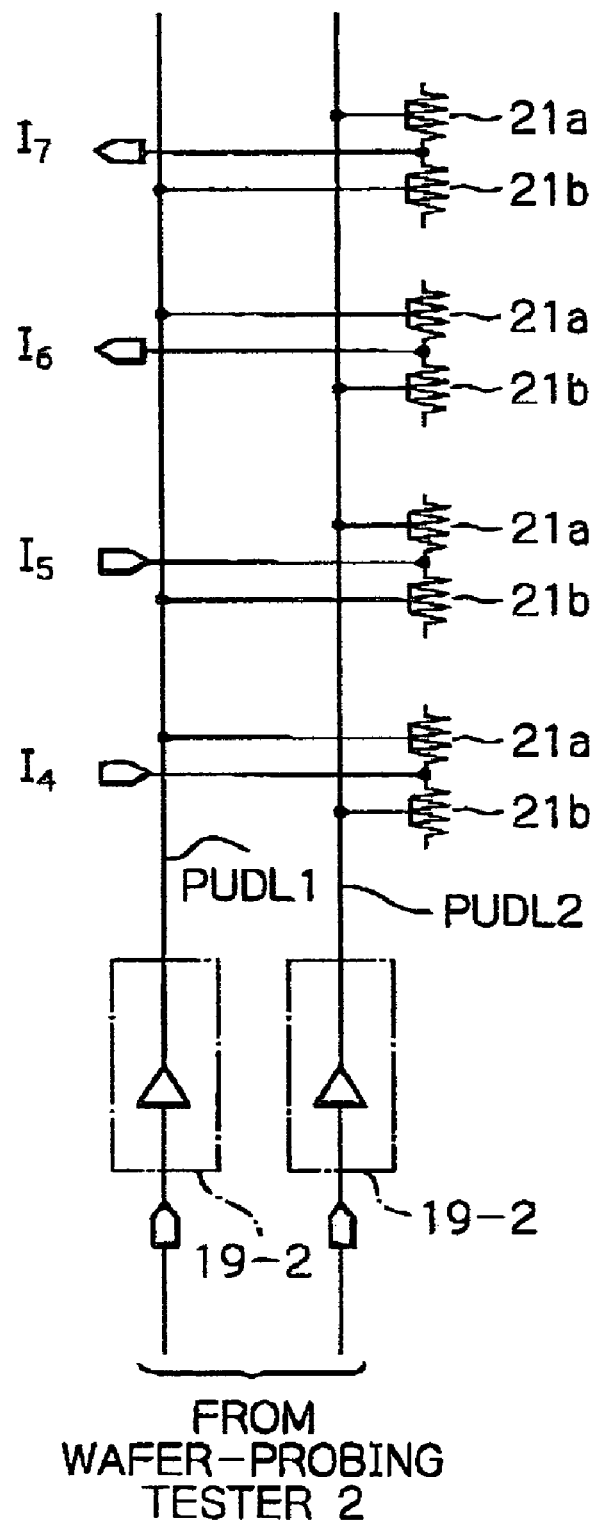
FIG. 10A is a circuit diagram illustrating a modification of the pull-up/pull-down control line of the semiconductor logic circuit device of FIG. 2.

For example, as illustrated in FIG. 10A, two pull-up/pull-down control lines PUDL1 and PUDL2 as well as two pull-up/pull-down control buffers 19-1 and 19-2 are provided. In this case, one of the pull-up/pull-down control lines PUDL1 and PUDL2 is selected, final test input patterns can be increased about twice as illustrated in FIG. 10B. For example, the predetermined test input patterns by the pull-up/pull-down control lines PUDL1 and PUDL2 are as follows:

($I_4$, $I_5$, $I_6$, $I_7$)=(1, 0, 0, 1) for PUDL1; and
($I_4$, $I_5$, $I_6$, $I_7$)=(1 0, 0, 1) for PUDL2.

Figure 11A:
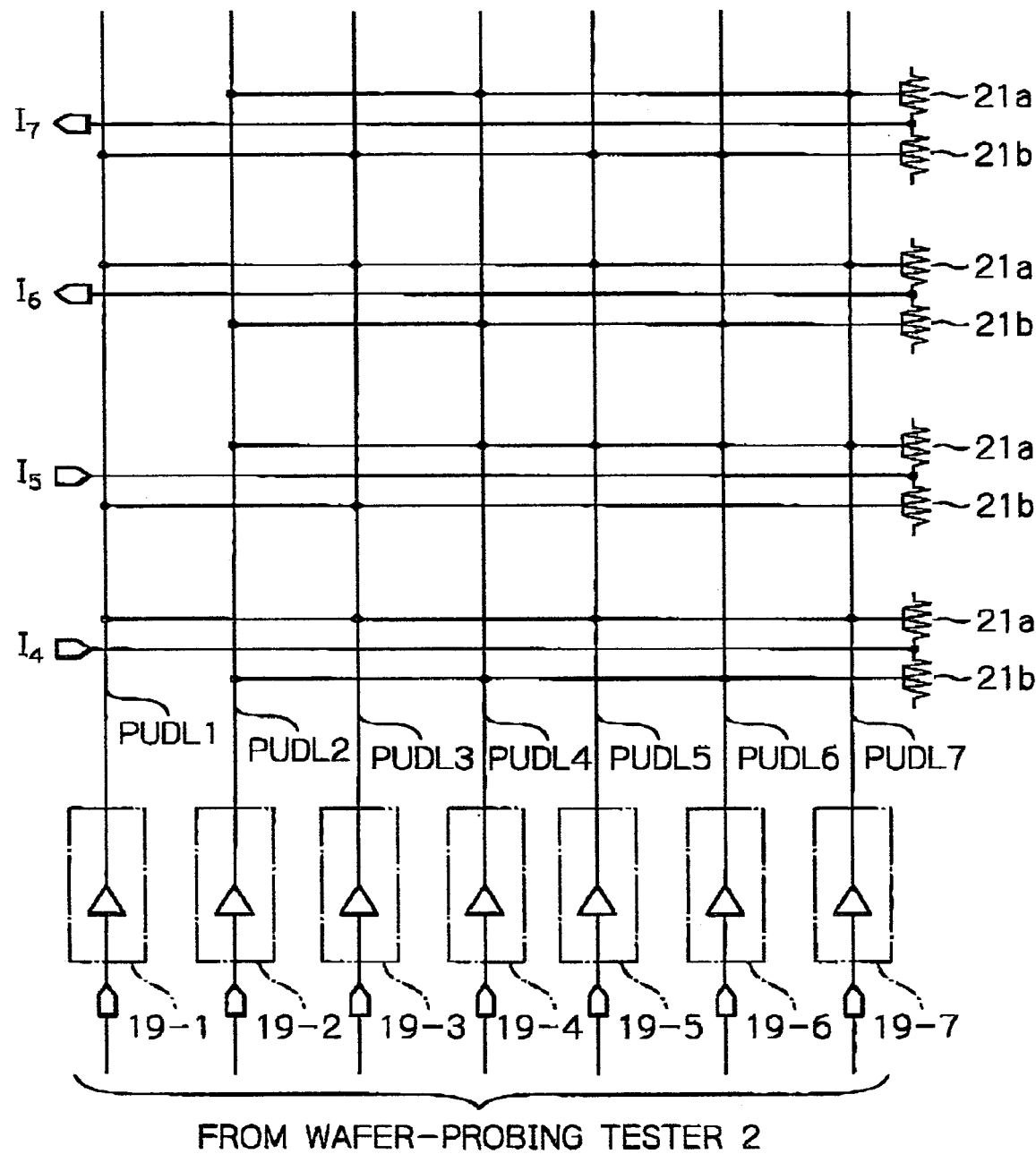
FIGS. 11A and 11B are circuit diagrams illustrating other modifications of the pull-up/pull-down control line of the semiconductor logic circuit device of FIG. 2.
Figure 11B:
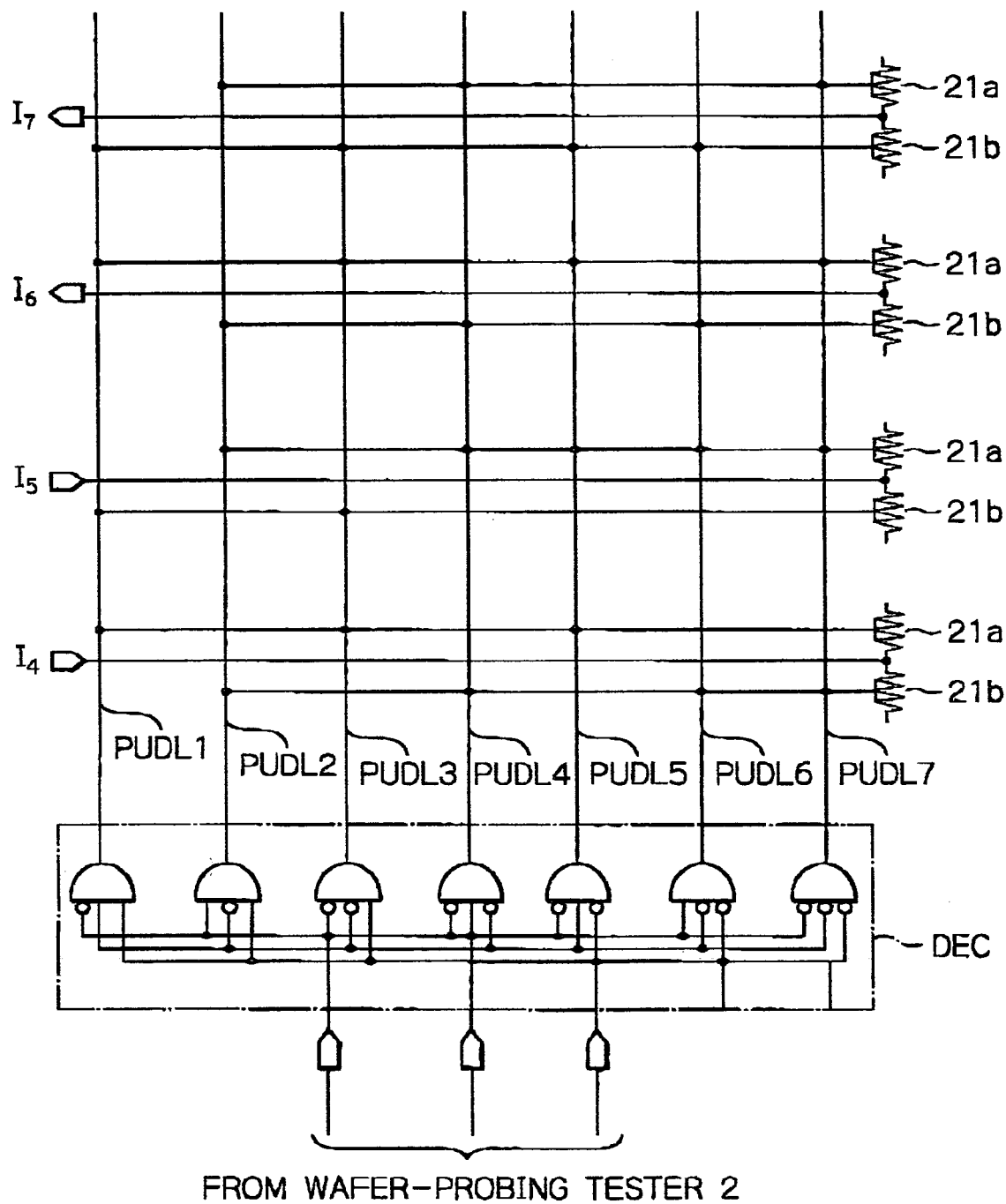

Similarly, as illustrated in FIG. 11A, seven pull-up/pull-down control lines PUDL1, PUDL2, ..., PUDL7 as well as pull-up/pull-down control buffers 19-1, 19-2, ..., 19-7 are provided. In this case, when one of the pull-up/pull-down control lines PUDL1, PUDL2, ..., PUDL7 is selected, final test input patterns can be increased about seven times. For example, the predetermined test input patterns by the pull-up/pull-down control lines PUDL1, PUDL2, ..., PUDL7 are as follows:

($I_4$, $I_5$, $I_6$, $I_7$)=(1, 0, 0, 1) for PUDL1;
($I_4$, $I_5$, $I_6$, $I_7$)=(0, 1, 1, 0) for PUDL2;
($I_4$, $I_5$, $I_6$, $I_7$)=(1, 0, 1, 0) for PUDL3;
($I_4$, $I_5$, $I_6$, $I_7$)=(0, 1, 0, 1) for PUDL4;
($I_4$, $I_5$, $I_6$, $I_7$)=(1, 1, 1, 0) for PUDL5;
($I_4$, $I_5$, $I_6$, $I_7$)=(0, 1, 0, 0) for PUDL6; and
($I_4$, $I_5$, $I_6$, $I_7$)=(0, 1, 1, 1) for PUDL7.

In FIG. 11A, the number of probes (pins) of the wafer-probing tester 2 is increased to increase the manufacturing cost thereof. In order to decrease the number of probes (pins) of FIG. 11A, the pull-up/pull-down control buffers 19-1, 19-2, ..., 19-7 is replaced by a decoder DEC which requires only three probes (pins). Note that, when all the voltages at the pads of the decoder DEC are low (="0"), the decoder DEC is in a non-selection state so that all the pull-up/pull-down control lines PUDL1, PUDL2, ..., PUDL7 are in a floating state.

Note that the present invention can also be applied to a semiconductor logic circuit device where the scan path chain SPC and the boundary scan path chain BSPC are not provided. In this case, test data is inputted in parallel to the scan path registers, although the probes (pins) of the wafer-probing tester 2 are increased. Also, test result data is outputted from the input/output buffers and the output buffers, although the probes (pins) of the wafer-probing tester 2 are increased.

In the above-described embodiment, input buffers and input/output buffers are both provided; however, in the present invention, the input buffers and the input/output buffers are defined simply as input buffers, particularly in the claims.

As explained hereinabove, according to the present invention, since final test input patterns are inputted in parallel to the internal circuit (combination circuits), the test time can be decreased without a specialized probe card.

The invention claimed is:

1. A semiconductor logic circuit device comprising:
an internal circuit;
a group of first pads;
a group of second pads; and
a plurality of input buffers, each connected between said internal circuit and one of said first and second pads, for supplying input signals from their corresponding pads to said internal circuit,
each of said first pads being operatively connected to one of a pull-up circuit for pulling up a voltage at said each of said first pads to a first voltage and a pull-down circuit for pulling down the voltage at said each of said first pads to a second voltage lower than said first voltage, and
said second pads providing parallel external test input patterns to said corresponding pads.

2. The semiconductor logic circuit device as set forth in claim 1, further comprising: a pull-up/pull-down control pad; a pull-up/pull-down control buffer having an input connected to said pull-up/pull-down control pad and an output; and a pull-up/pull-down control line, connected between the output of said pull-up/pull-down control buffer, and said pull-up circuit and said pull-down circuit, for controlling said pull-up circuit and said pull-down circuit in accordance with a voltage at the output of said pull-up/pull-down control buffer.

3. The semiconductor logic circuit device as set forth in claim 1, wherein said pull-up circuit comprises a P-channel MOS transistor having a gate for receiving one of a control signal and its inverted signal, a source for receiving said first voltage and a drain connected to a corresponding one of said first pads, and wherein said pull-down circuit comprises an N-channel MOS transistor having a-gate, for receiving the other of said control signal and its inverted signal, a source for receiving said second voltage and a drain connected to a corresponding one of said first pads.

4. The semiconductor logic circuit device as set forth in claim 1, further comprising: a boundary scan-in pad; a boundary scan-in buffer connected to said scan-in pad; a boundary scan-out pad; a boundary scan-out buffer connected to said scan-out pad; a scan path chain, connected between said boundary scan-in buffer and said boundary scan-out buffer, said boundary scan path chain including boundary scan path registers connected to said internal circuit.

5. A semiconductor logic circuit device comprising:
an internal circuit;
a group of first pads;
a group of second pads; and
a plurality of input buffers, each connected between said internal circuit and one of said first and second pads, for supplying input signals from their corresponding pads to said internal circuit,
each of said first pads being connected to at least one of a pull-up circuit for pulling up a voltage at said each of said first pads to a first voltage and a pull-down circuit for pulling down the voltage at said each of said first pads to a second voltage lower than said first voltage,
further comprising: a scan-in pad; a scan-in buffer connected to said scan-in pad; a scan-out pad; a scan-out buffer connected to said scan-out pad; a scan path chain including scan path registers connected to said internal circuit.

6. A method for testing a semiconductor logic circuit device comprising an internal circuit, a group of first pads, a group of second pads and a plurality of input buffers each connected between said internal circuit and one of said first and second pads, each of said first pads being operatively connected to one of a pull-up circuit and a pull-down circuit, comprising: applying predetermined reference voltages to said first pads by operating said pull-up circuit and said pull-down circuit; and applying parallel test input signals to said second pads from the exterior.

7. The method as set forth in claim 6, further comprising selecting said predetermined reference voltages from a plurality of sets of predetermined reference voltages.

8. The method as set forth in claim 6, further comprising inputting test data to said internal circuit via a scan path chain.

9. The method as set forth in claim 8, further comprising outputting test result data from said internal circuit via said scan path chain.

10. The method as set forth in claim 6, further comprising outputting test result data from said internal circuit via a boundary scan path chain.

11. A semiconductor logic circuit device comprising:
an internal circuit; a plurality of pads;
a plurality of input buffers, each connected between said internal circuit and one of said pads, for supplying input signals from their corresponding pads to said internal circuit, each of one set of said pads being connected to one of a pull-up circuit for pulling up a voltage at said pads to a first voltage and a pull-down circuit for pulling down the voltage at said pads to a second voltage lower than said first voltage; and
another set of pads connected for receiving parallel exterior test input patterns.

12. The semiconductor logic circuit device as set forth in claim 11, further comprising:
a pull-up/pull-down control pad;
a pull-up/pull-down control buffer having an input connected to said pull-up/pull-down control pad and an output; and
a pull-up/pull-down control line, connected between the output of said pull-up/pull-down control buffer, and said pull-up circuit and said pull-down circuit, for controlling said pull-up circuit and said pull-down circuit in accordance with a voltage at the output of said pull-up/pull-down control buffer.

13. The semiconductor logic circuit device as set forth in claim 11, wherein said pull-up circuit comprises a P-channel MOS transistor having a gate for receiving one of a control signal and its inverted signal, a source for receiving said first voltage and a drain connected to a corresponding one of said pads, and wherein said pull-down circuit comprises an N-channel KOS transistor having a gate, for receiving the other of said control signal and its inverted signal, a source for receiving said second voltage and a drain connected to a corresponding one of said pads.

14. A semiconductor logic circuit device comprising:
an internal circuit;
a plurality of pads;
a plurality of input buffers, each connected between said internal circuit and one of said pads, for supplying input signals from their corresponding pads to said internal circuit, each of said pads being connected to at least one of a pull-up circuit for pulling up a voltage at said each of said pads to a first voltage and a pull-down circuit for pulling down the voltage at said each of said pads to a second voltage lower than said first voltage;
further comprising: a scan-in pad; a scan-in buffer connected to said scan-in pad; a scan-out pad; a scan-out buffer connected to said scan-out pad; a scan path chain, connected between said scan-in butter and said scan-out buffer, said scan path chain including scan path registers connected to said internal circuit.

15. A semiconductor logic circuit device comprising:
an internal circuit; and
a plurality of pads;
a plurality of input buffers, each connected between said internal circuit and one of said pads, for supplying input signals from their corresponding pads to said internal circuit, each of said pads being connected to at least one of a pull-up circuit for pulling up a voltage at said each of said pads to a first voltage and a pull-down circuit for pulling down the voltage at said each of said pads to a second voltage lower than said first voltage;
further comprising: a boundary scan-in pad; a boundary scan-in buffer connected to said scan-in pad; a boundary scan-out pad; a boundary scan-out buffer connected to said scan-out pad; a scan path chain, connected between said boundary scan-in buffer and said boundary scan-out buffer, said boundary scan path chain including boundary scan path registers connected to said internal circuit.

16. A method for testing a semiconductor logic circuit device comprising an internal circuit, a plurality of pads comprising first pads and second pads, and a plurality of input buffers each connected between said internal circuit and one of said first and second pads, each of said first pads being operatively connected to one of a pull-up and a pull-down circuit, the method comprising:
applying predetermined reference voltages to said pads by operating said pull-up circuit and said pull-down circuit; and
applying parallel exterior test input signals to said second pads.

17. The method as set forth in claim 16, further comprising selecting said predetermined reference voltages from a plurality of sets of predetermined reference voltages.

18. The method as set forth in claim 16, further comprising inputting test data to said internal circuit via a scan path chain.

19. The method as set forth in claim 18, further comprising outputting test result data from said internal circuit via said scan path chain.

20. The method as set forth in claim 16, further comprising outputting test result data from said internal circuit via a boundary scan path chain.

21. A method for testing a semiconductor logic circuit device including an internal circuit, a group of first pads, a group of second pads, a group of third pads, a pull-up/pull-down control pad being connected to a pull-up/pull-down control buffer, a plurality of input buffers, each connected between said internal circuit and one of said first and second pads, for supplying input signals from their corresponding pads to said internal circuit, each of said first pads being connected to at least one of a pull-up circuit for pulling up a voltage at said each of said first pads to a first voltage and a pull-down circuit for pulling down the voltage to said each of said first pads to a second voltage lower than said first voltage, a plurality of output buffers, each connected between said internal circuit and one of said third pads, output of said pull-up/pull-down control buffer connected to said pull-up circuit or said pull-down circuit, said method comprising:
supplying a control signal to said pull-up/pull-down control pad a first part of a test pattern to said first pads;
supplying a second part of said test pattern to said second pads; and
comparing first test result data output from said third pads with expected data.

* * * * *